(12) United States Patent
Yen et al.

(10) Patent No.: US 9,196,589 B2
(45) Date of Patent: Nov. 24, 2015

(54) STACKED WAFER STRUCTURE AND METHOD FOR STACKING A WAFER

(71) Applicant: Xintec Inc., Jhongli (TW)

(72) Inventors: Yu-Lin Yen, Jhongli (TW); Hsi-Chien Lin, Jhongli (TW); Yeh-Shih Ho, Jhongli (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 13/845,728

(22) Filed: Mar. 18, 2013

(65) Prior Publication Data

US 2013/0285215 A1   Oct. 31, 2013

Related U.S. Application Data

(60) Provisional application No. 61/614,802, filed on Mar. 23, 2012.

(51) Int. Cl.
  *H01L 29/06* (2006.01)
  *H01L 23/00* (2006.01)
  *H01L 21/50* (2006.01)
  *B81C 1/00* (2006.01)
  *B81C 3/00* (2006.01)

(52) U.S. Cl.
  CPC .......... *H01L 23/562* (2013.01); *B81C 1/00269* (2013.01); *B81C 1/00357* (2013.01); *B81C 3/001* (2013.01); *H01L 21/50* (2013.01); *B81C 2201/019* (2013.01); *H01L 2924/0002* (2013.01)

(58) Field of Classification Search
  CPC ................. H01L 25/0657; H01L 2224/83385; B81C 1/00269; B81C 2203/0118
  USPC .................................... 257/623, 777; 438/109
  See application file for complete search history.

(56) References Cited

U.S. PATENT DOCUMENTS

| 7,354,799 B2 * | 4/2008 | Kinderknecht et al. ...... 438/109 |
| 2007/0105370 A1 | 5/2007 | Kinderknecht et al. |
| 2009/0250810 A1 | 10/2009 | Pendse |

FOREIGN PATENT DOCUMENTS

| CN | 1354379 | 6/2002 |
| CN | 101315897 | 12/2008 |

* cited by examiner

*Primary Examiner* — Howard Weiss
(74) *Attorney, Agent, or Firm* — Liu & Liu

(57) ABSTRACT

A stacked wafer structure includes a substrate; dams provided on the substrate and having protrusions on a surface thereof; and a wafer with recesses provided on the dam. The protrusions on the surface of the dams are wedged into the recesses of the wafer, preventing air chambers from forming between the recesses of the wafer and the dams, so that the wafer is not separated from the dams due to the presence of air chambers during subsequent packaging process. A method for stacking a wafer is also provided.

10 Claims, 4 Drawing Sheets

FIG.2A"

STACKED WAFER STRUCTURE AND METHOD FOR STACKING A WAFER

This application claims the benefit of priority under 35 U.S.C. §119(e) to U.S. Provisional Application No. 61/614,802, filed Mar. 23, 2012, the contents of which application are incorporated herein by reference.

BACKGROUND OF THE INVENTION

1. Field of the Invention

The present invention relates to a stacked structure of a semiconductor device and a method for stacking it, and, more particularly, to a stacked wafer structure and a method for stacking the wafer.

2. Description of Related Art

As the electronics industry flourishes, the semiconductor flat packaging techniques have reached their limit, and demand for miniaturization is met by product integration. Techniques for stacking wafers have become a new area of development, and the development is moving towards stacking of multiple homogeneous or heterogeneous wafers to achieve multi-functional purposes.

FIGS. 1A and 1B are schematic diagrams showing a method for manufacturing a wafer structure 1 according to the prior art. As shown in FIG. 1A, a plurality of dams 11 are formed on a substrate 10 made of silicon or glass, for example. Then, as shown in FIG. 1B, a wafer 12 is bonded onto the dams 11.

However, the surface of a normal wafer 12 is not flat, so air chambers P are formed between recesses 120 of the wafer 12 and the dams 11. When the subsequently packaging process is performed on the stacked wafer structure 1, the air trapped in the air chambers P will thermally expand like bubbles and push against the wafer 12, causing detachment and displacement of the wafer 12 from the dams 11, yielding defective products.

FIGS. 1A' and 1B' are schematic diagrams showing another method for manufacturing a stacked wafer structure 1' according to the prior art. As shown, each dam 11' has a plurality of through holes 110 running through the dam 11' for protrusions 121 of the wafer 12 to be wedged therein, so that the recesses 120 of the wafer 12 can be abutted against the dam 11', reinforcing the bonding strength between the wafer 12 and the dams 11'.

However, in the conventional stacked wafer structure 1', since the dams 11' are formed with through holes 110, so stress resulting from supporting the wafer 12 will concentrate around the walls of the through holes 110, and is not distributed. This makes the dams 11' more likely to crack, and as a result, the wafer 12 may slant or come off and become defective.

Furthermore, since the through holes 110 run through the dams 11', the through holes 110 is so deep that the protrusions 121 of the wafer cannot make contact with the substrate 10. This leaves too much space P' in the through holes 110, and the air trapped inside these through holes 110 will thermally expand and push against the wafer 12 during subsequent manufacturing processes of the stacked wafer structure 1'.

Thus, there is an urgent need for a technique that solves the prior-art problems mentioned above.

SUMMARY OF THE INVENTION

In light of the foregoing drawbacks, the present invention provides a stacked wafer structure, including: a substrate; at least one dam provided on the substrate and having protrusions on a surface thereof; and a wafer provided on the dam, with the protrusions embedded into the wafer.

The present invention further provides a method for stacking a wafer, including the steps of forming on a substrate at least one dam having protrusions thereon, and combining a wafer onto the dam.

In said structure and method, the substrate can be a silicon substrate or a glass substrate, and the protrusions can be wedged into the wafer.

In said structure and method, the dam at least includes a first layer coupled to the substrate and a second layer coupled to the wafer. The first layer and the second layer can be made of the same or different material. Alternatively, the first layer and the substrate are made of the same material, and the second layer and the wafer are made of the same material.

In addition, according to said structure and method, the protrusions can be formed by forming through holes that penetrate the first layer or the second layer.

The stacked wafer structure and the method for stacking the wafer according to the present invention provide dams with protrusions against which the recesses of the wafer can be abutted. Therefore, the occurrence of air chambers can be avoided, and the wafer and dams of the present invention will not be separated due to air pressure during subsequent packing process.

Furthermore, the dams can be designed to have multiple layers in order to control the depth of the through holes and limit the remaining space in the through holes, effectively eliminating air in the through holes to push against the wafer.

In addition, with the multi-layer design of the dams, the stress for supporting the wafer can be distributed to various layers, and will not be concentrated on the layer with the through holes, thereby eliminating breaking of the dams, and in turn, preventing the wafer from slanting or coming off.

BRIEF DESCRIPTION OF THE DRAWINGS

The present invention can be more fully understood by reading the following detailed description of the preferred embodiments, with reference made to the accompanying drawings, wherein:

FIGS. 1A and 1B are cross-sectional diagrams illustrating a method for manufacturing a traditional stacked wafer structure, wherein FIG. 1B is a partially enlarged view of a subsequent step of FIG. 1A;

FIGS. 1A' and 1B' are a partial perspective view and a partial cross-sectional view illustrating another method for manufacturing a traditional stacked wafer structure, respectively;

DETAILED DESCRIPTION OF THE INVENTION

Figure 1A:
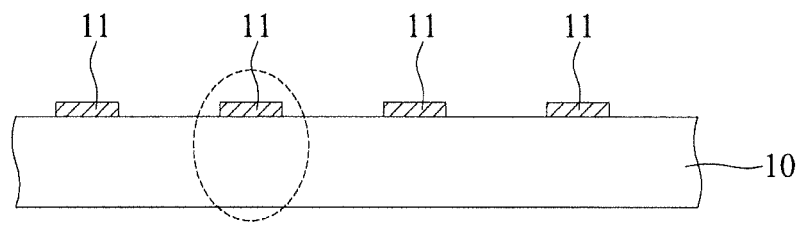
Figure 1B:
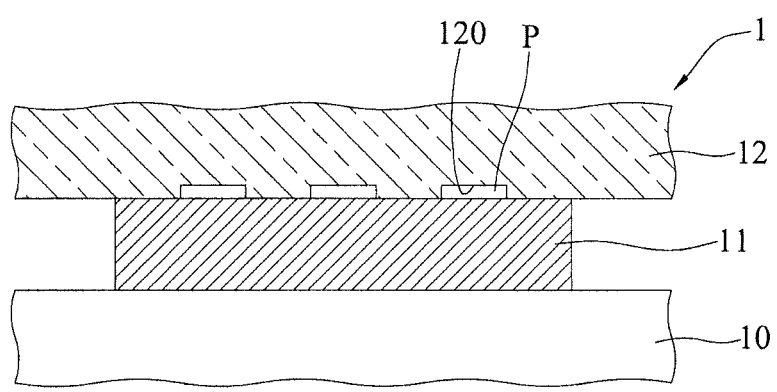
Figure 1A:
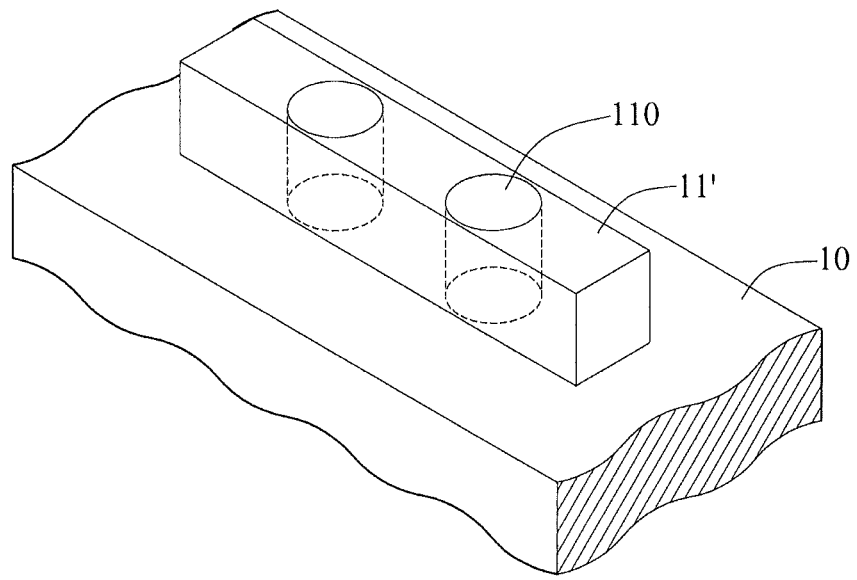
Figure 1B:
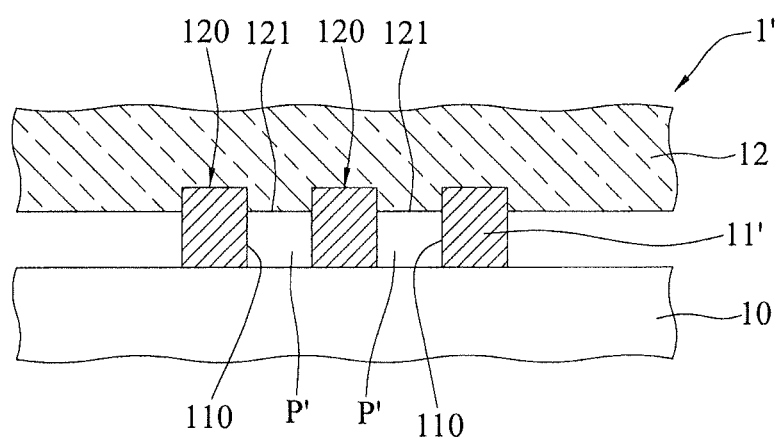

The present invention is described by the following specific embodiments. Those with ordinary skills in the arts can readily understand the other advantages and functions of the present invention after reading the disclosure of this specification.

It should be noted that the structures, ratios, sizes and the like depicted in the drawings of this specification are merely used to accompany the disclosure herein and to facilitate understanding and reading by those skilled in the art. They should not be construed as to define the conditions in which the present invention can be implemented, and thus bear no technical real significance. Any modifications to the structures, changes in the ratios and adjustments to the sizes that do not affect the effects generated and objectives achieved by the present invention will fall within the technical contents disclosed herein. Meanwhile, terms such as "one", "a" or "an" used herein should be interpreted in a illustrative rather than limiting sense.

In the present invention, semiconductor packages formed by stacking, packaging and singulating wafers are applicable to various MEMSs (Micro Electro Mechanical System), in particular image sensors for measuring electrical or capacitive changes. Especially, wafer scale packaging process can be used for semiconductor packages such as image sensing elements, RF circuits, accelerators, gyroscopes, micro actuators, or pressure sensors.

Figure 2A:
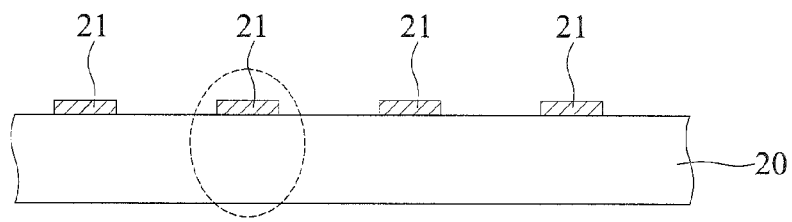
FIGS. 2A and 2B are cross-sectional diagrams illustrating a method for stacking a wafer according to the present invention, wherein FIG. 2A' is a partially enlarged view of FIG. 2A, and FIG. 2A" is a perspective view of FIG. 2A.
Figure 2A:
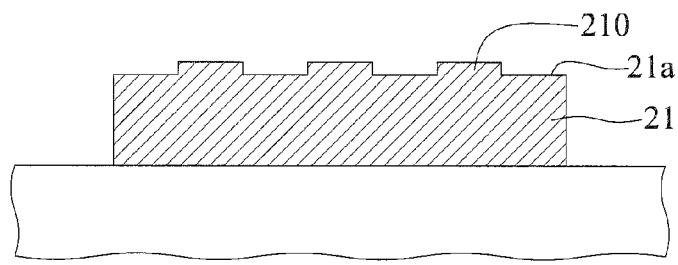
Figure 2B:
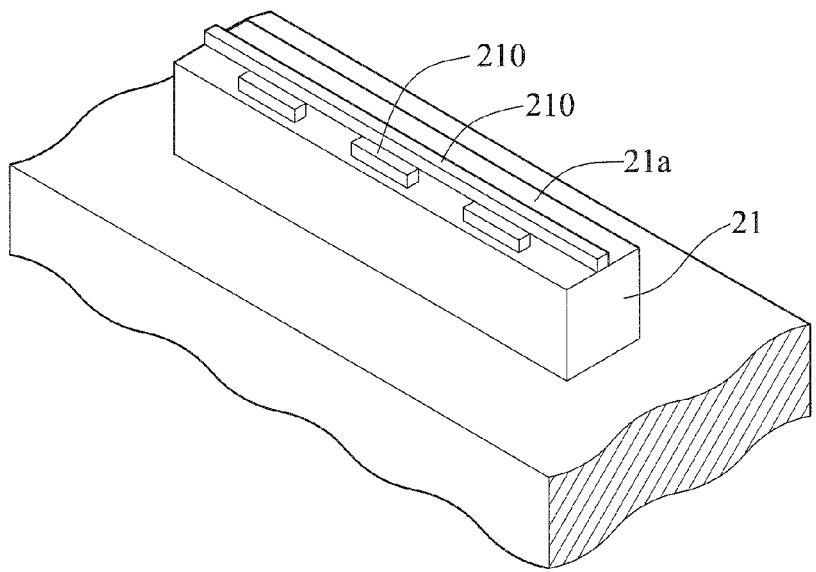
Figure 2B:
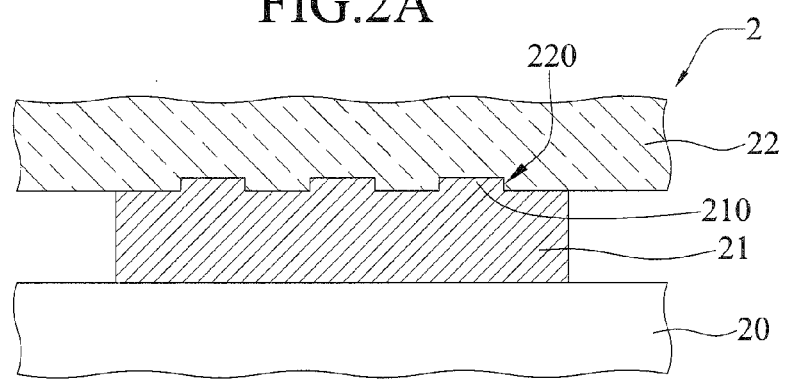

Referring to FIGS. 2A to 2B, diagrams illustrating an embodiment of a method for stacking a wafer according to the present invention are shown.

As shown in FIGS. 2A, 2A' and 2A", a substrate 20 is provided, and a plurality of dams 21 are formed on the substrate 20. A plurality of protrusions 210 are formed on the top surface 21a of each of the dams 21 by techniques such as etching.

In this embodiment, the substrate 20 is a silicon substrate or glass substrate.

As shown in FIG. 2B, a wafer 22 with a plurality of recesses 220 is bonded onto the dams 21. The protrusions 210 of the dams 21 are embedded into the recesses 220 of the wafer 22.

In an embodiment, a plurality of protrusions 210 formed on each of the dams 21 can be wedged into the corresponding recesses 220 of the wafer 22. This not only reinforces the bonding strength between the wafer 22 and the dams 21, but also avoids air chambers to be formed between the recesses 220 of the wafer 22 and the dams 21, so that, during subsequent manufacturing process of the stacked wafer structure 2, the wafer 22 and the dams 21 will not be separated due to increase of air pressure. As a result, reliability of the products can be improved compared to prior art.

Furthermore, the dams 21 of this embodiment do not form holes that penetrate the dams 21, so stress for supporting the wafer 22 can be effectively distributed, eliminating breaking of the dams 21, and in turn, preventing the wafer 22 from slanting or coming off.

Figure 3A:
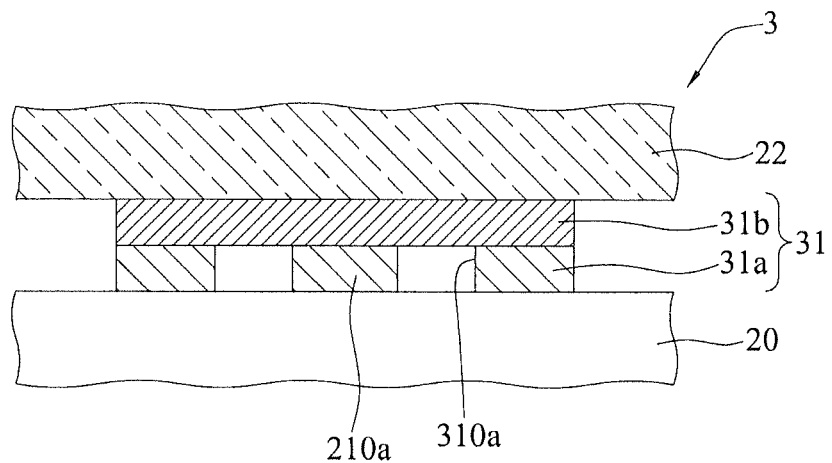
FIGS. 3A and 3B are partial cross-sectional diagrams illustrating another embodiment of manufacturing the dams in the method for stacking a wafer according to the present invention.
Figure 3B:
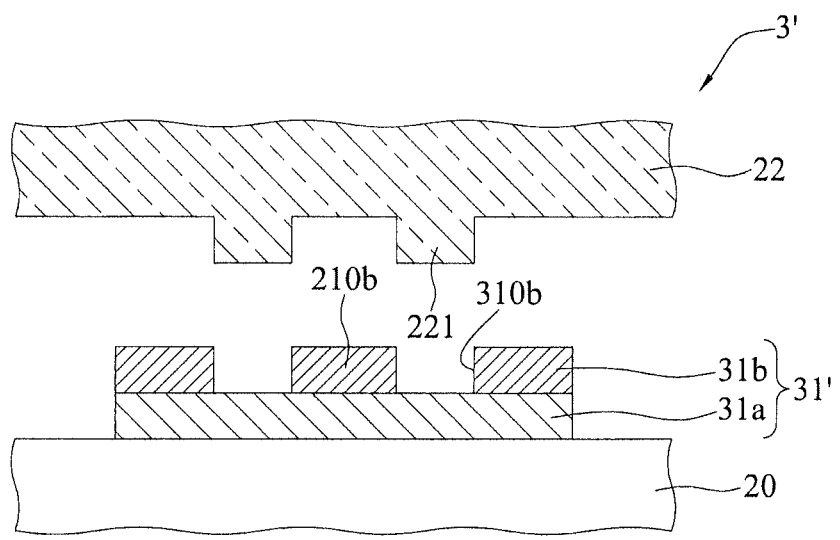

Referring now to FIGS. 3A and 3B, diagrams illustrating another embodiment of manufacturing dams 31 and 31' are shown. As shown in FIGS. 3A and 3B, the dams 31 and 31' include a first layer 31a coupled to the substrate 20 and a second layer 31b coupled to the substrate 22. The first layer 31a and the second layer 31b can be made of the same or different material.

In this embodiment, in order to increase bonding strength between various interfaces, the first layer 31a and the substrate 20 are made of the same material, and the second layer 31b and the wafer 22 are also made of the same material, avoiding delamination caused by differences in coefficients of temperature expansion (CTE).

Moreover, one or more additional layers can be stacked between the first layer 31a and the second layer 31b as needed, so that the number of layers of the dams 31 and 31' are at least two.

As shown in FIG. 3A, through holes 310a penetrating the first layer 31a are formed, so that protrusions 210a are formed on the surface of the second layer 31b of the dam 31. Alternatively, as shown in FIG. 3B, through holes 310b penetrating the second layer 31b are formed, so that protrusions 210b are formed on the surface of the first layer 31b of the dam 31'.

The through holes 310a and 310b according to the present invention only penetrate one of layers of the dams 31 and 31', respectively, and not the whole dam 31 and 31', so stress for supporting the wafer 22 can be distributed to the other layer, thereby eliminating breaking of the dams 31 and 31', and in turn, preventing the wafer 22 from slanting or coming off. Compared to the prior art, the reliability of the products can be further improved.

Furthermore, as shown in FIG. 3B, since the through holes 310b only penetrate the second layer 31b of the dam 31', the depth of the through holes 310b can be effectively controlled, so the protrusions 221 of the wafer contact only the first layer 31a of the dam 31', and the remaining space in the through holes 310b is greatly reduced. As a result, when subsequent packaging process is performed, the small quantity of air in the through holes 310b will not push against the wafer 22 due to thermal expansion.

The stacked wafer structures 2, 3 and 3' according to the present invention each includes the substrate 20, the plurality of dams 21, 31 and 31' with protrusions 210, 210a and 210b on surfaces thereof are provided on the substrate 20 and the wafer 22 provided on the dams 21, 31 and 31'.

The substrate 20 can be a silicon substrate or a glass substrate, for example.

In the dams 21, 31 and 31', in an embodiment, the protrusions 210 are wedged into the recesses 220 of the wafer 22. In another embodiment, the dams 31 and 31' include the first layer 31a coupled to the substrate 20 and the second layer 31b coupled to the wafer 22, and the first layer 31a and the second layer 31b are the protrusions 210a and 210b, respectively, and the recesses 220 of the wafer 22 receive the second layer 31b used as the protrusions 210b.

In summary, the stacked wafer structure and the method for stacking the wafer according to the present invention provides dams with protrusions against which the recesses of the wafer can be abutted, thus avoiding the occurrence of air chambers.

Furthermore, the dams can be designed to have multiple layers in order to control the depth of the through holes and limit the remaining space in the through holes, effectively eliminating air in the through holes to push against the wafer.

In addition, with the multi-layer design of the dams, the stress for supporting the wafer can be distributed to various layers, avoiding stress being concentrated on the layer with the through holes.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A stacked wafer structure, comprising:
   a substrate having a substantially planar surface;
   at least a dam formed on the substrate, wherein the dam comprises at least a first layer formed on the planar surface of the substrate and coupled to the substrate, and a plurality of first protrusions formed on the first layer defining a plurality of through holes therebetween, and wherein portions of the first layer are exposed by the through holes; and
   a wafer having a plurality of second protrusions conforming to the through holes, wherein the first layer and the first protrusions are made of different materials, and each of the second protrusions of the wafer is wedged in one of the through holes and abuts against the corresponding exposed portion of the first layer.

2. The stacked wafer structure of claim 1, wherein the substrate is a silicon substrate or a glass substrate.

3. The stacked wafer structure of claim 1, wherein the first protrusions and the wafer are made of the same material.

4. A stacked wafer structure, comprising:
 a substrate having a substantially planar surface;
 at least a dam formed on the substrate, comprising a plurality of first protrusions disposed on the substrate and defining a plurality of through holes therebetween, and a second layer disposed on the plurality of the first protrusions and sealing the plurality of through holes without filling the through holes; and
 a wafer disposed on the second layer.

5. The stacked wafer structure of claim 4, wherein the plurality of the first protrusions and the second layer are separate layers.

6. The stacked wafer structure of claim 4, wherein the substrate is a silicon substrate or a glass substrate.

7. The stacked wafer structure of claim 4, wherein the first protrusions and the substrate are made of the same material, and the second layer and the wafer are made of the same material.

8. A method for stacking a wafer, comprising:
 forming a first layer on a substantially planar substrate;
 forming a plurality of first protrusions on the first layer to define a plurality of through holes therebetween, and wherein portions of the first layer are exposed by the through holes; and
 disposing a wafer having a plurality of second protrusions conforming to the through holes,
 wherein the first layer and the first protrusions are made of different materials, and each of the second protrusions is wedged in one of the through holes and abuts against the corresponding exposed portion of the first layer.

9. The method of claim 8, wherein the substrate is a silicon substrate or a glass substrate.

10. The method of claim 8, wherein the first layer and the substrate are made of the same material, and the first protrusions and the wafer are made of the same material.

\* \* \* \* \*